(12) United States Patent
Hosein

(10) Patent No.: US 11,022,888 B2
(45) Date of Patent: Jun. 1, 2021

(54) SYNTHESIS OF SUPERHYDROPHOBIC MICROPOROUS SURFACES VIA LIGHT-DIRECTED PHOTOPOLYMERIZATION AND PHASE SEPARATION

(71) Applicant: Ian D. Hosein, Minoa, NY (US)

(72) Inventor: Ian D. Hosein, Minoa, NY (US)

(73) Assignee: Syracuse University, Syracuse, NY (US)

( * ) Notice: Subject to any disclaimer, the term of this patent is extended or adjusted under 35 U.S.C. 154(b) by 20 days.

(21) Appl. No.: 16/164,910

(22) Filed: Oct. 19, 2018

(65) Prior Publication Data

US 2019/0127548 A1     May 2, 2019

Related U.S. Application Data

(60) Provisional application No. 62/579,964, filed on Nov. 1, 2017.

(51) Int. Cl.
| | | |
|---|---|---|
| *G03F 7/20* | (2006.01) |
| *C08J 9/36* | (2006.01) |
| *G03F 7/16* | (2006.01) |
| *G03F 7/031* | (2006.01) |
| *C08J 9/28* | (2006.01) |
| *G03F 7/004* | (2006.01) |
| *G03F 7/027* | (2006.01) |

(52) U.S. Cl.
CPC ............ *G03F 7/2014* (2013.01); *C08J 9/28* (2013.01); *C08J 9/365* (2013.01); *G03F 7/0048* (2013.01); *G03F 7/027* (2013.01); *G03F 7/031* (2013.01); *G03F 7/16* (2013.01); *G03F 7/168* (2013.01); *G03F 7/2004* (2013.01); *C08J 2201/0502* (2013.01); *C08J 2205/044* (2013.01); *C08J 2335/02* (2013.01); *C08J 2427/18* (2013.01)

(58) Field of Classification Search
CPC .................................. G03F 7/16; G03F 7/027
See application file for complete search history.

(56) References Cited

U.S. PATENT DOCUMENTS

| | | | | |
|---|---|---|---|---|
| 2004/0171135 A1* | 9/2004 | Ostuni | ................... | C12N 11/08 435/283.1 |
| 2015/0266051 A1* | 9/2015 | Park | ....................... | H01L 31/18 427/510 |
| 2018/0148378 A1* | 5/2018 | Mayr | ................ | A61C 13/0019 |

\* cited by examiner

*Primary Examiner* — Kathleen Duda
(74) *Attorney, Agent, or Firm* — Bond Schoeneck and King PLLC; David Nocilly

(57) ABSTRACT

The formation of microporous surfaces through polymer induced phase separation in a photopolymer solvent mixture using photopolymerization via light self-focusing and self-trapping. The self-trapping of light sets fixed regions of brightness and darkness, sustained by the polymerization of light, and then wave guiding within the substrate. Phase separation occurs with the solvent phase separating in the regions of darkness and crosslinking in the regions of brightness. Upon removal of the solvent, precise and uniformly dispersed pores are created in the surface. The pore size and spacing may be tuned by adjusting the weight fraction of the photopolymer solvent mixture as well as through changes in the mask pattern.

11 Claims, 7 Drawing Sheets

SYNTHESIS OF SUPERHYDROPHOBIC MICROPOROUS SURFACES VIA LIGHT-DIRECTED PHOTOPOLYMERIZATION AND PHASE SEPARATION

CROSS-REFERENCE TO RELATED APPLICATIONS

The present application claims priority to U.S. Provisional App. No. 62/579,964, filed on Nov. 1, 2017.

BACKGROUND OF THE INVENTION

1. Field of the Invention

The present invention relates to microporous surfaces and, more particularly, to the combination of photopolymerization induced phase separation and light self-trapping in photopolymer-solvent mixtures to control the formation of pores.

2. Description of the Related Art

Living systems abound with surface anatomies possessing inherent porous, texture, or roughened designs that confer special surface properties. Examples include the lotus leaf, insect legs and wings, bird feathers, mosquito eyes, fish scales, and even human bone. Such structures have inspired creation of biomimetic surface structures as a critical aspect of materials surface design of importance to applications in anti-wetting, water collection, anti-fogging, anti-corrosion, anti-fouling, anti-icing, self-healing, and cell adhesion, drag reduction, enhanced boiling, cell growth, and tissue engineering. Extensive effort has focused on developing methods to fabricate surfaces with, particularly, tailored porosity, including electrospinning, templating, differential etching, photolithography, replication, treated fabrics, meshes, coatings, as well as nanoparticle coated surfaces. Such porous structures provide the necessary microscopic surface roughness to induce hydrophobicity, which can be enhanced through additional coating or surface functionalization. While significant progress has been achieved using such methods, all suffer from the inherent trade-off between precise control over structure and scalability. For example, lithography is the most precise, but least scalable; deposition methods are quite most scalable, but least precise. Hence, to realize the functionality of microporous surfaces in large-scale applications, a straightforward, scalable synthetic approach is highly desirable.

Photopolymerization is an attractive approach to materials synthesis, owing to its low energy input, ability to react close systems (i.e., through a transparent barrier), scalability, easy capability to control the reaction through variation in irradiation source intensity. It is widely used to develop materials for applications in thin-films, coatings, printing, graphic work, dentistry, contact lenses, and electronics. Several groups have employed photopolymerization in photopolymer-solvent mixtures, wherein the mixture undergoes a polymerization-induced phase separation (PIPS). Upon solvent removed, materials possessing a microporous surface structure are produced. While characteristically straightforward and scalable, presently only random porous structure can be attained, and inhibits engineering their surface structure to the degree where fine-tunable structure-property relations can be established. In terms of surface design, particularly, concurrent control over pore geometry, size, and spacing remain allusive.

Accordingly, there is a need in the art for an approach that enables a high degree of control of structured porosity while providing a scalable process and thus avoids the trade-off between precision and scalability that is the shortcoming of current methods.

BRIEF SUMMARY OF THE INVENTION

The present invention is a new strategy that creates precise, periodic microporous patterned surfaces by combining polymerization-induced phase separation (PIPS) with the transmission of the irradiating light source under non-linear optical conditions. More specifically, the present invention includes a method of fabricating a porous surface having the steps of providing a mixture including a monomer and a solvent, positioning a mask having a predetermined series of chrome regions over the mixture to define a series of dark regions that correspond to the series of chrome regions in the mask and an irradiated region, irradiating the mixture through the mask so that the monomer is polymerized into a polymer in the irradiated portions and the solvent phase separates out of the irradiated region of the mixture into the series of dark regions, and removing the monomer and the solvent in the dark regions to define a polymer substrate having a surface defining a series of pores. The method may include the step of spray coating the polymer surface with a plurality of nanoparticles. The nanoparticles may comprise polytetrafluoroethylene (PTFE). The step of irradiating the mixture may comprise irradiating with light having a wavelength of 470 nm. The step of irradiating the mixture may comprise irradiating with light at an exposure intensity between 2 and 20 mW/cm2. The monomer may comprise trimethylolpropane triacrylate (TMPTA). The solvent may comprise dimethyl sulfoxide (DMSO). The ratio of the monomer to the solvent may range from 9:1 to 6:4 by weight percent. Rach of the predetermined series of chrome regions may have a diameter between 10 and 40 micrometers. The predetermined series of chrome regions may be spaced apart from each other by a distance between 50 and 100 micrometers. The polymer substrate may have a thickness between 100 and 400 micrometers.

The present invention may also comprise a microporous structure formed according to the present invention. The structure comprises a polymerized monomer having a surface defined by a series of pores having a diameter ranging from 10 to 40 micrometers and that are spaced apart from each other by a distance ranging from 50 to 100 micrometers. The microporous structure may have a thickness between 100 and 400 micrometers. The monomer may comprise trimethylolpropane triacrylate (TMPTA). The surface may be coated with a plurality of nanoparticles. The nanoparticles may comprise polytetrafluoroethylene (PTFE).

BRIEF DESCRIPTION OF THE SEVERAL VIEWS OF THE DRAWING(S)

The present invention will be more fully understood and appreciated by reading the following Detailed Description in conjunction with the accompanying drawings, in which:

FIG. 1 is a schematic of the synthesis of superhydrophobic microporous surfaces according to the present invention where a photopolymer/solvent mixture is illuminated from the bottom with LED light that undergoes self-focusing and causes phase separation that forms pores in the polymerized mixture;

FIG. 2 is series of images showing spontaneous filamentation in the bright regions of a blue LED sourced optical profile (15 mW/cm$^2$) in a TMPTA/DMSO mixture (90/10) for masks (a-c) 40/100 and (d-f) 40/200, where (a) and (d) show the transverse profiles of transmitted light at the onset of photocuring (t=0 min.), (b) and (e) show them after filamentation (t=20 min.), and (c) and (f) show close-up images that reveal the filaments, in their respective samples;

FIG. 3 is a series of images showing the morphology and structure characterization of the microporous surface formed according to the present invention, where (a) is a Raman volume map of the cured photopolymer-solvent mixture and the insets show xy (z=0 μm) and xz (y=0 μm) slices of the volume; and (b) is SEM images of a single pore and surrounding microporous TMPTA matrix, where magnified images of the pore and surface reveal the complete coverage of the PFTE nanoparticle coating;

Figure 6:
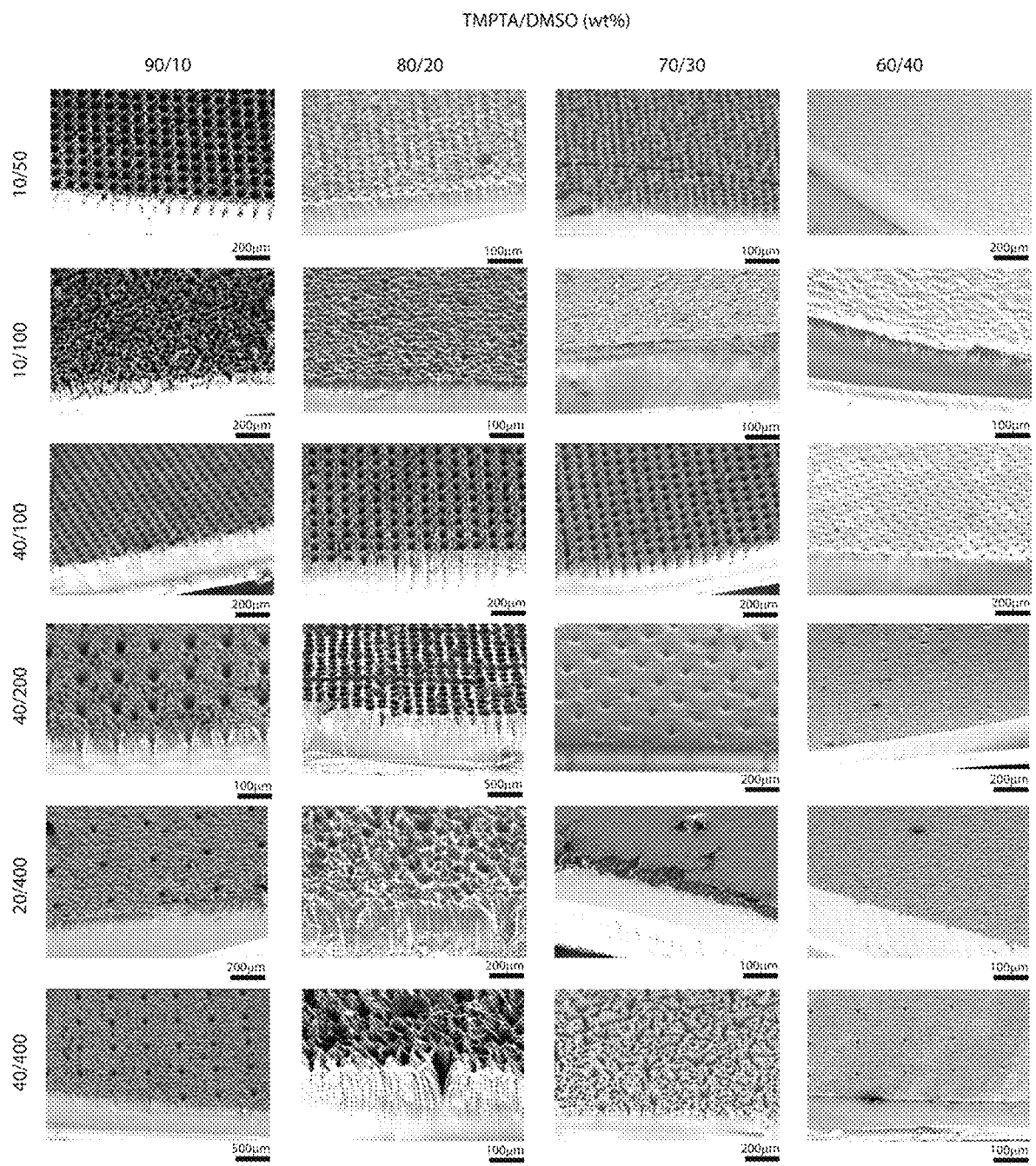
Figure 7:
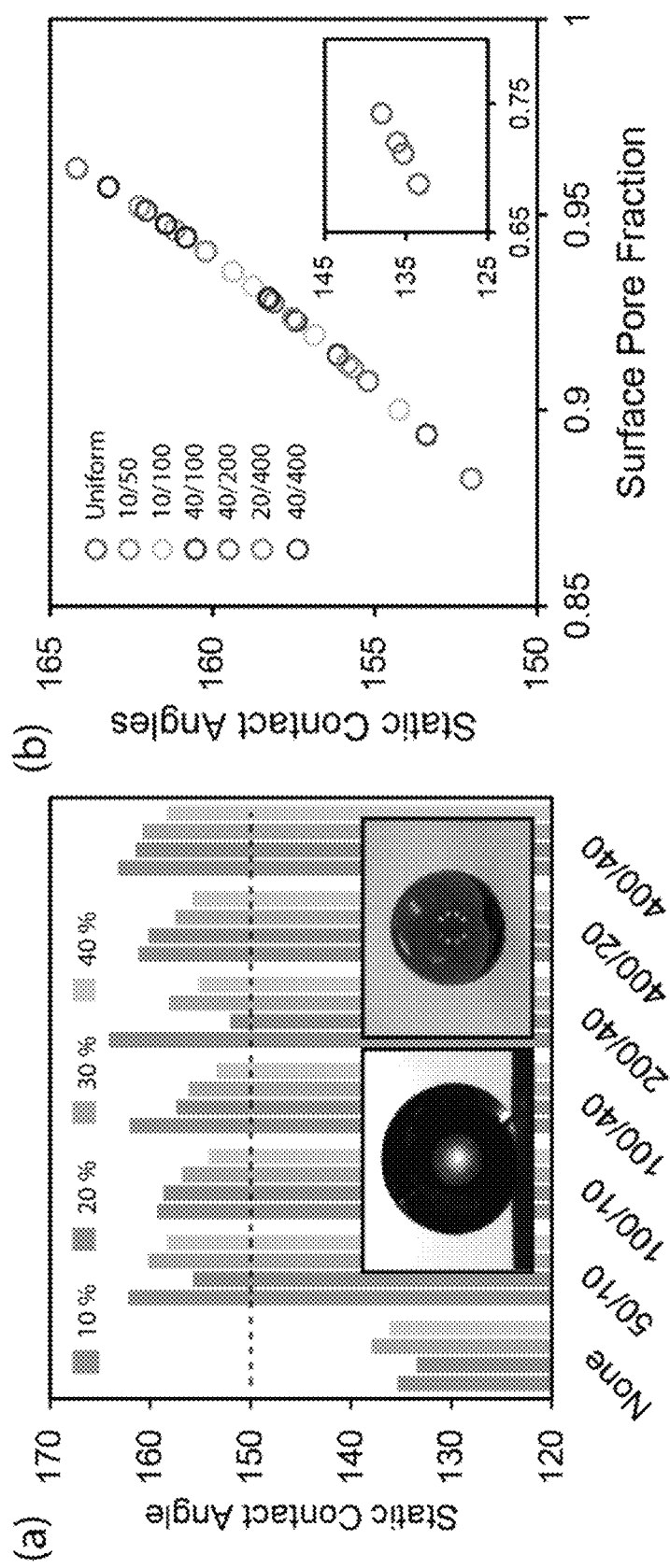

FIG. 6 is a series of perspective images of fabricated microporous surfaces mapped over a range of photomask configurations (rows) and DMSO weight fractions (columns); and FIG. 7 is a series of charts of contact angle measurements for water droplets on microporous surfaces according to the present invention, where (a) is measured contact angles (average over 10 measurements) for samples fabricated with different mask configurations over DMSO weight fraction in the mixtures (dotted line indicates the demarcation above which samples are superhydrophobic) and insets show an exemplary water droplet displaying high contact angle for a structure made from an 80/20 mixture and 40/200 (low surface wetting) with a macro-lens image of a blue-dyed large-scale droplet overlaying the surface; (b) is contact angles plotted against surface pore fraction, with inset (bottom) showing data for uniformly irradiated samples.

DETAILED DESCRIPTION OF THE INVENTION

Figure 1:
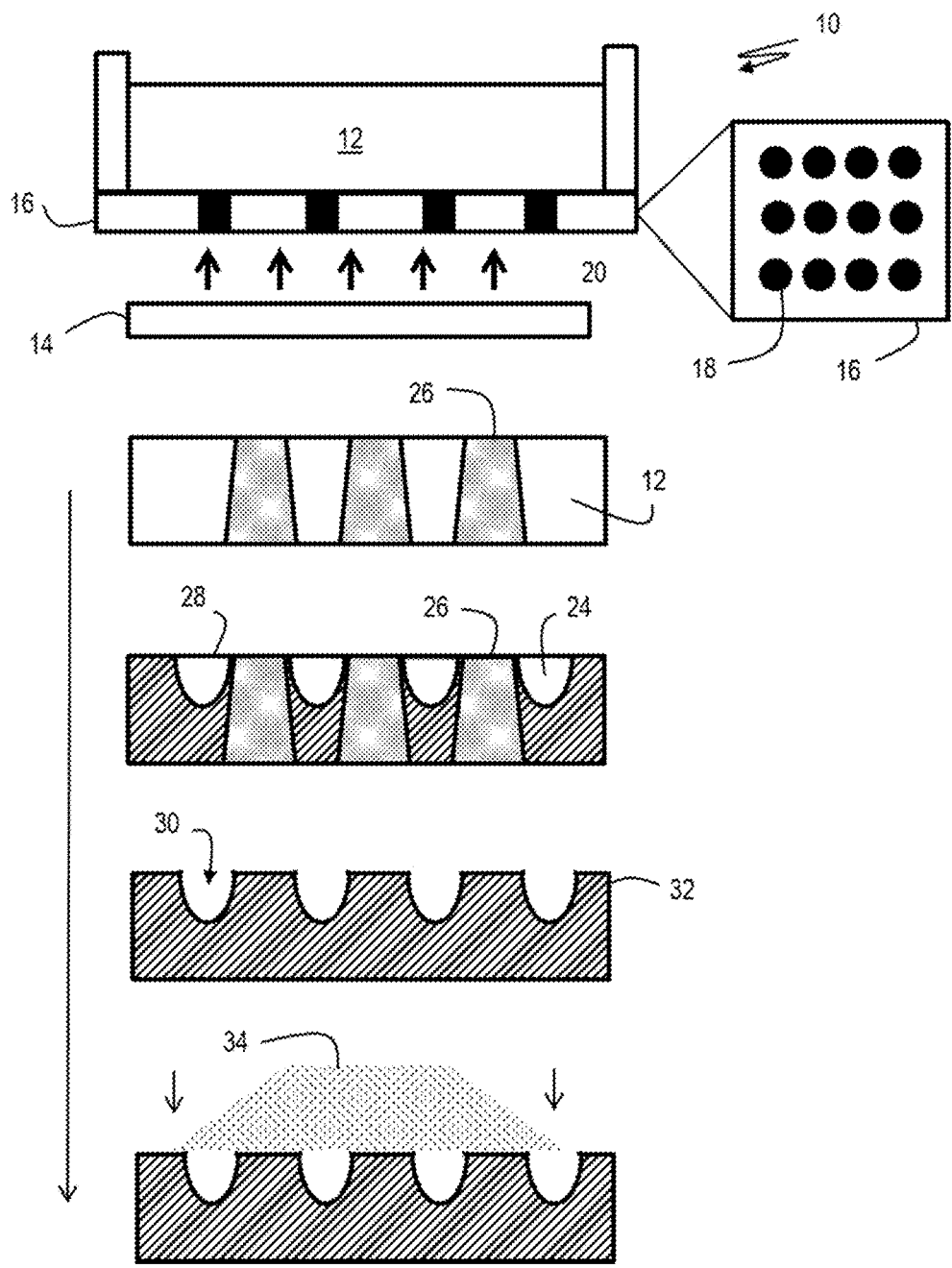

Referring to the figures, wherein like numeral refer to like parts throughout, there is seen in FIG. 1, an approach to fabricating microporous structures surfaces 10 according to the present invention. A mixture of TMPTA and DMSO 12 is irradiated with collimated LED light from a light source 14 and the intensity profile of the light is modulated by an optical mask 16. Mask 16 consists of a periodic array of circular chrome regions 18 which modulates the input light 20 to have a periodic array of circular dark regions. The modulated light pattern undergoes self-focusing and self-trapping over the course of irradiation. With increased polymerization, the DMSO phase 24 separates out of the bright regions 26 (where polymerization is predominately occurring) into the dark regions 28. Pores 30 form at the back end 32, or "exit face" of the mixture 12, where light leaves mixture 12. Nanoparticles 34, such as polytetrafluoroethylene (PTFE), may be spray coated on the porous surface for enhanced functionality.

The present invention therefore provides a new strategy that creates precise, periodic microporous patterned surfaces by combining polymerization-induced phase separation (PIPS) with the transmission of the irradiating light source under nonlinear optical conditions. Optical nonlinearity is characterized by an intensity dependent refractive index, which can be elicited in photopolymerizable media, owing to polymerization-induced changes in refractive index associated with the increase in molecular weight of the polymer. Under suitable conditions, when a wide-area light source propagates through a photopolymerizable medium, it experiences a self-focusing effect that counters it natural tendency to diverge in space. As a result, the light undergoes spontaneous division into a multitude of densely packed, microscale filaments, each of which is characterized by divergence-free propagation in their own self-induced waveguide. This division results in the spatial profile of an input light field becoming "self-trapped," thereby preserving its distribution over the depth of the medium while being contained in the ensemble of filaments. Hence, spatial patterns programed into the transmitted light (i.e., via a photomask) in turn imprint a congruent pattern in the medium. This pattern formation process can be elicited using incoherent, visible light sources (e.g., LEDS, incandescent light). The patterning mechanism of the present invention, when employed in a binary mixture, can induce a spatially-precise form of PIPS, where the resultant binary phase morphology possess a congruent pattern is the irradiating optical pattern; namely, with one polymer component in the bright regions and the other in the dark regions. Hence, the combination of PIPS with the self-focusing of a light, enables and optical pattern to be programed into binary phase morphology.

This combination of PIPS and light self-focusing is employed in a photopolymer-solvent mixture, wherein the solvent behaves as a porogen. The mixture is irradiated with a uniform, visible light source (LED) that is modulated by an optical mask to produce a periodic array of circular dark regions in the transmitted intensity profile. Self-trapping of this pattern preserves through profile over the depth of the sample to allow photopolymerization to occur predominately in the bright regions. As result of the spatially localized photopolymerization that induced PIPS, solvent is expelled into the dark regions. Subsequent removal of the solvent leaves the presence of pores at the surface of the material, with a uniform size and spacing that faithfully replicates the pattern of the optical mask. Pores may be tuned through design of the optical mask as well as the weight fraction of solvent in the mixture or adjusting the effects of the mixture height and irradiation intensity. The microporous structures formed according to the invention may be transformed into superhydrophobic surfaces by applying a thin layer of polytetrafluoroethylene (PTFE) nanoparticles, such as via spray coating. The present invention thus provides a straightforward approach for forming tunable microporous surface textures, and provides scalable control over the characteristics of the surface porosity.

In one example, the samples were irradiated for an extended period (~1 hour) to ensure maximal curing of the TMPTA. The DMSO was removed through washing, and subsequent vacuum drying at 100° C., thereby leaving the surface pores. To generate surface structures that possess hydrophobicity, the porous surface was spray coated with hydrophobic Teflon nanoparticles (100-300 nm size range).

The coating confers the surface with a lower surface energy, as well as high surface roughness, whereby hydrophobicity can be further enhanced. The result is a solid, mildly flexible, thin film. With LEDs that produce 2" diameter collimated beams, films of similar size could be processed as described above.

Figure 2:
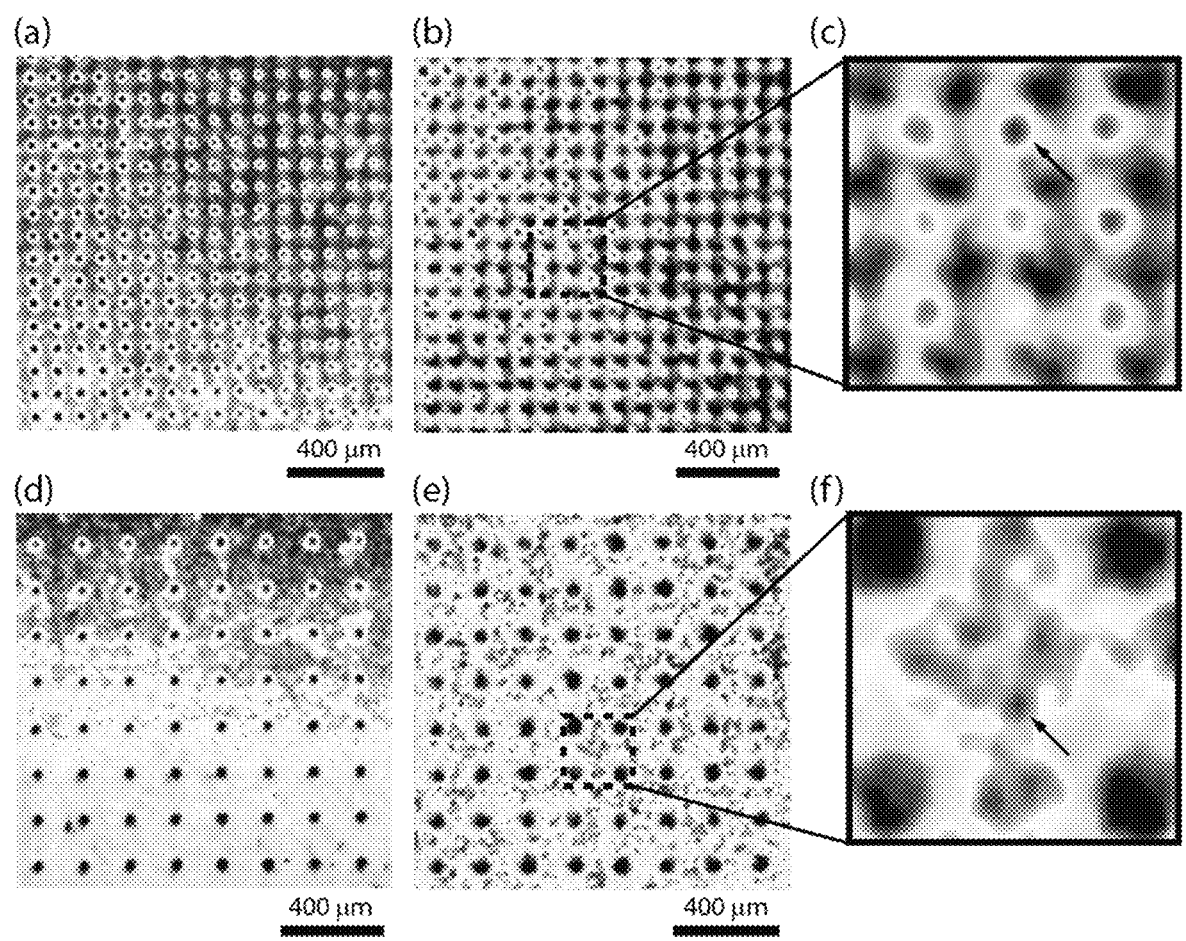

Referring to FIG. 2, the transmitted light undergoes spontaneous filamentation over the course of irradiation. The filaments are indicated by their high intensity spots in the transverse profile of transmitted light. The individual filament sizes were ~80 In the case of the 40/100 mask, the limited spacing in the bright region allows for only a single filament to form, resulting in a periodic arrangement of filaments forced to have same symmetry and spacing as the mask. Visual examination of the profiles reveals that, in the case of the 40/100 mask, the filaments are perfectly centered in the bright region, i.e. offset from the dark regions by $1/\sqrt{2}a$ diagonally, where a is the lattice spacing of the mask (i.e., 100 μm). Whereas, in the 40/200 mask, the bright region is larger than a single filament, and thus multiple filaments can form within it. This self-trapped optical profile, consisting of bright and dark regions, is retained over the period of irradiation. The self-focusing phenomenon is also indicated by the small increase in the size of the dark regions over the course of irradiation, which indicates the confinement of light over time to a slightly tighter region. This optical pattern formation is general observed under low intensity conditions (on the order of mW/cm$^2$), as higher intensities would cause the mixture of cure too quickly to enable to dynamic interaction between light and the mixture.

Figure 3:
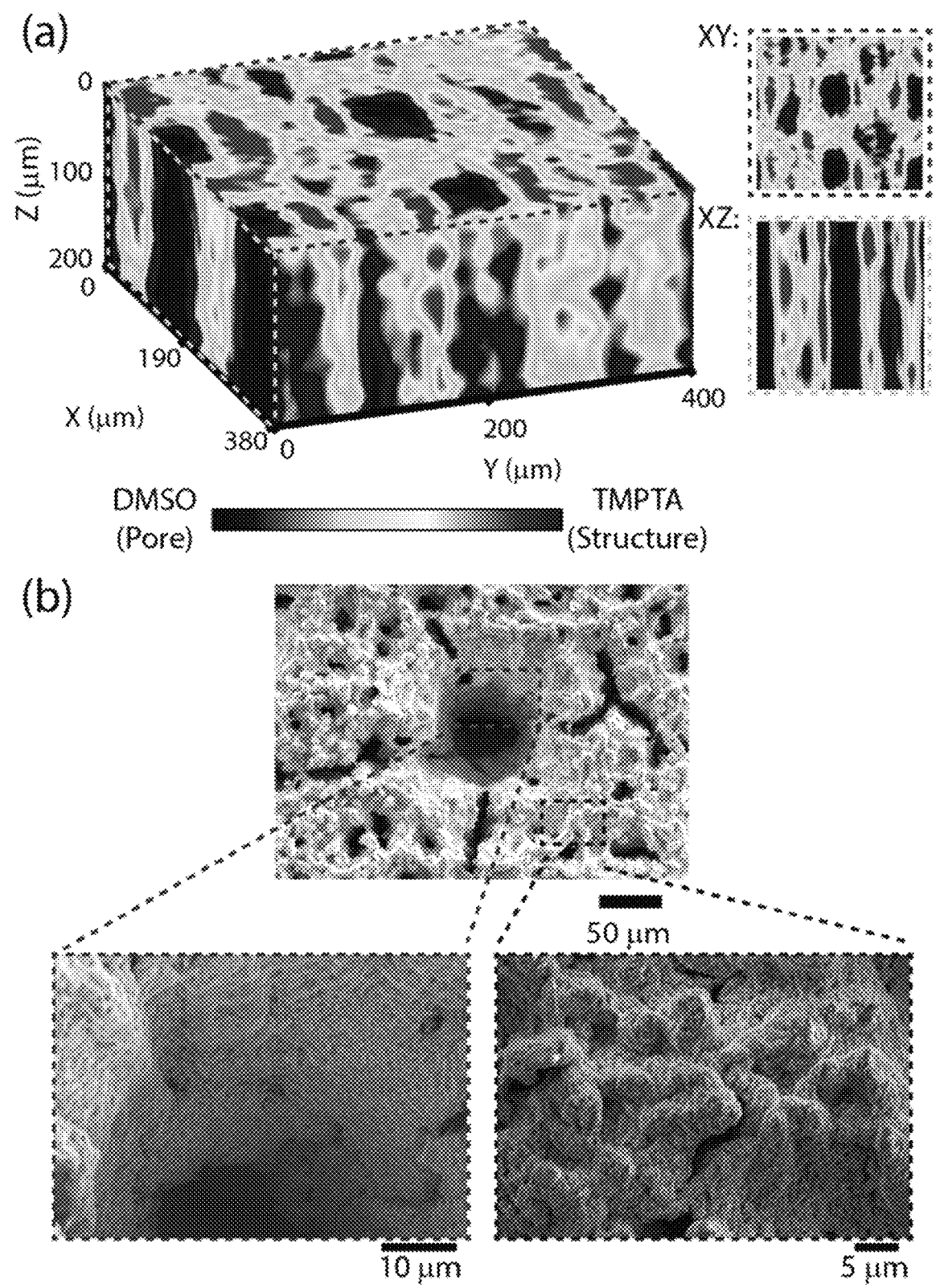

There is seen in FIG. 3 the resultant morphology through Raman volume imaging and SEM (FIG. 3a), particularly with respect to the top surface. At the surface and subsurface of the materials, a typical sample reveals a binary phase morphology where the TMPTA occupies regions corresponding to the irradiated areas and the DMSO occupies the dark regions. In other words, the irradiation process has induced the mixture to phase separate, and the phase separated morphology is spatially congruent to the transverse optical profile of the transmitted light. Removal of solvent leaves a TMPTA surface with micro-scale pores. Additionally, there is the presence of smaller pores and a pore network within the TMPTA matrix itself, indicating that random phase separation has also occurred in the bright regions. Thus, the surface possesses a hierarchical pore structure consisting of the "major" pores dictated by the mask pattern, and randomly sized but generally smaller powers in the surroundings. SEM images also confirm that thorough coverage and nanoscale texture, or roughness, provided to the surface by the PTFE nanoparticles coating, both on the surface as well as within the pores themselves. This data confirms that the photopolymer-solvent mixture undergoes PIPS, where it attains a congruent arrangement with the bright-dark pattern of the self-trapped transmitted intensity profile. The evidence of phase separation of DMSO from TMPTA is observed only near the exit surface of the sample. In contrast, the bottom surface of the film was smooth with no evident formation of pores.

Figure 4:
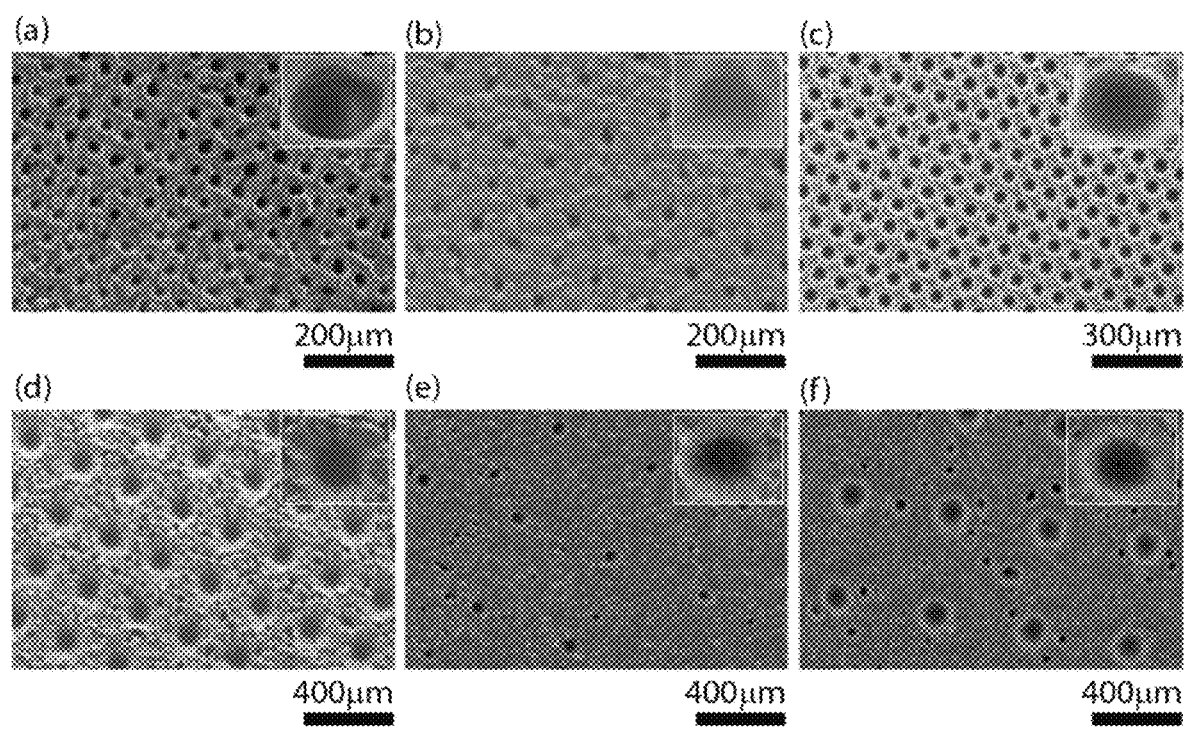
FIG. 4 is a series of images showing the final microporous surface structures for TMPTA/DMSO mixtures of 90/10 for different mask patterns as follows: (a) 10/50, (b) 10/100, (c) 40/100, (d) 40/200, (e) 20/400, and (f) 40/400.

Referring to FIG. 4, the final structure of the films when different mask configurations were employed may be seen. By varying the configuration of the mask pattern in terms of the circular chrome size and spacing, periodic microporous surface structures consisting of different pore sizes and pore-to-pore spacing were formed. The position and size of the pores correlate to the size and spacing of the mask. Periodic (square symmetry) porous structures were attained over the entire 2 square inch area film under irradiation. Structures could also be produced for a range of film thicknesses (i.e., photopolymer-solvent mixture heights) such as from 100-400 μm.

Figure 5:
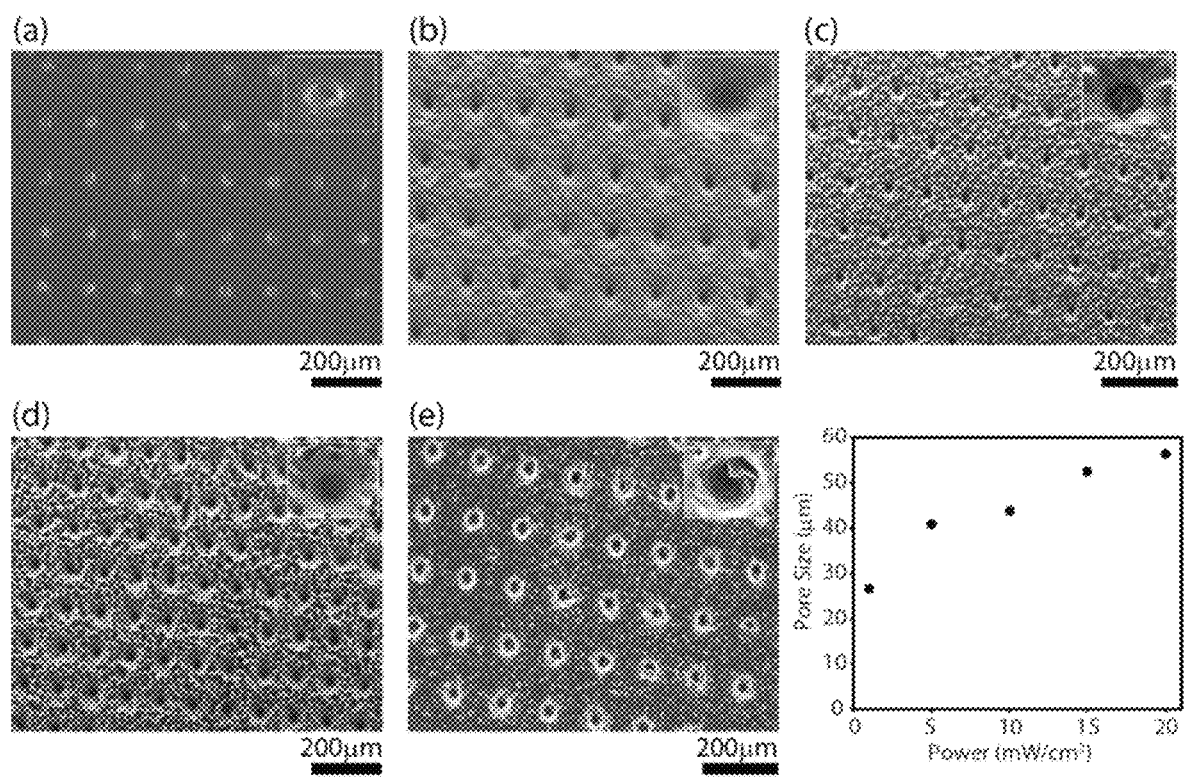
FIG. 5 is a series of images showing the effect of exposure intensity on the final pore size and relative depth for a mixture of 90/10 and a mask of 100/40, where irradiation intensities are: (a) 2, (b) 5, (c) 10, (d) 15, and (e) 20 mW/cm$^2$, and (f) is a plot of the average power size against the exposure intensity with insets showing close-up images of a single pore.

Irradiation with appropriate exposure intensity is critical to pore formation. FIG. 5 shows SEM images of films irradiated at different intensities, which shows the formation of wider pores with increased power. The results shown in FIG. 5 and hereafter employed an irradiation intensity of 15 mW/cm$^2$. The variation in pore size was unaffected by irradiation time, namely, longer irradiation times to account for lower intensities yielding slower reactions did not increase the pore size further.

FIG. 6 shows perspective images of the microporous surfaces that reveal the cross-sectional structure of the film mapped over different mask configurations and solvent weight fractions. FIG. 6 shows the spectrum of different surface morphologies that can be achieved with the process of the present invention, which ranges from relatively smooth surfaces with individual pores, to roughened surfaces with individual pores, all the way to extremely rough surfaces with the porosity of the matrix is compared to the pores themselves. All structures were achieved by varying the mask and the mixture fractions. FIG. 6 reveals the wide spectrum of different surface architectures that can be formed by changing the mask pattern as well as the relative weight fractions of TMPTA and DMSO. The architectures range from relatively smooth surfaces with the square arrays of holes, to highly roughed matrix with holes, to extremely surface roughness with array of holes almost indiscernible from the pores in the surroundings. Randomly structured, porous surfaces attained from uniform irradiation confirm this is a result of the spatial profile of the transmitted light. Surface structures with more densely packed pores were more likely to contain a higher degree roughness in the polymer surface. It can be observed from slices cut through a pore that most does not extend over the entire thickness of the sample. It should be recognized by those of skill in the art that the present invention can be used to form pores that extend through the entire thickness of the film to create a membrane by beginning with a thinner layer of TMPTA and DMSO.

Referring to FIG. 7, spray-coated samples showed superhydrophobic properties, as evidenced their larger static water contact angles (WCAs). Contact angles at or above 150° were attained for all samples. Generally, there was a decrease in the WCA for all mask configurations with an increase in DMSO fraction. Owing to the hierarchy of the pore structure, the measured contact angles were used to back-calculate the surface porosity of the samples in order to understand the correlation between the photomask and mixture to surface porosity where increased hydrophobicity is attained. The wetting of water on the surface can be described by the Cassie-Baxter equation:

$$\cos(\theta_r) = f_1 \cos(\theta_s) - f_2$$

where θr and θs are the WCAs of a rough surface and a smooth surface, respectively, and $f_1$ and $f_2$ are the fractional interfacial areas of a solid and air in contact with a liquid droplet, respectively ($f_1 + f_2 = 1$).

Based on the WCA for a smooth surface (89°) of TMPTA and the measured θr, $f_2$ was calculated. Plots of the WCA vs. surface pore fraction are shown in FIG. 7b. All samples, regardless of mask or DMSO fraction fall on the same curve dictated by the CV relationship. For a given mask, lower DMSO fractions are located higher on the curve. However, the spread and locations of their porosity and contact angle ranges reveal the range of attaining porosities and contact angles for each mask. Hence, for a desired major pore size, the DMSO can be varied to attain a particular porosity where the WCA is enhanced. Specifically, to increase the WCA for any mask, a lower fraction of DMSO should be used, and this shifts the samples upward along the curve show in FIG. 7b.

Testing of the present invention thus explored three key parameters in the determination of pore size: (1) the weight fraction of the components in the solution, (2) the height of the mixture in the reservoir, the lattice of which sets the thickness of the final cured film, and (3) the irradiation intensity. FIG. 4 shows the microporous structures fabricated with and without photomask from different fractions of DMSO. Masks with two different aperture diameters (10 and 40 μm) were used, and mixtures with different weight fractions of TMPTA and DMSO (90/10, 80/20, 70/30 and 60/40 wt %/wt %) were tested in order to tune pore diameter and spacing. SEM images of structures made without using mask show open pores were present for 90/10 and 80/20 blends while uniform and smooth structures were obtained for 70/30 and 60/40 blends. It can be observed for a certain weight fractions and photomasks that phase separation is achieved and the morphology surface of the structures is obviously porous as shown in FIG. 4 for 10/50, 10/100 and 20/400 photomasks for blends 90/10 and 80/20 and for 40/100, 40/200 and 40/400 photomask for all weight fractions.

The degree of surface roughness and the porosity, especial in the TMPTA matrix, is greater for mixtures with less weight fractions DMSO. One possible explanation is that an increase in DMSO causes the system to phase separate quicker than the time needed for DMSO to diffuse to the growing solvent "pore phase." Another explanation is that phase separation indeed occurs but is so quick that the pore phase is smaller, with phase separating occurring locally and not agglomerating to make larger sized phases. Another explanation is that at the higher weight fractions of TMPTA, the approach must have a higher degree of polymerization before phase separation occurs, in accordance with the temperature-composition coordinate entering under the spinodal line. This means that phase separation will occur under higher degrees of system elasticity and viscosity, reducing the diffusion capability, result more in localized phase separation, rather than formation and grow of the main pores.

The self-trapping phenomenon, as well as the pore formation, requires a threshold energy above which the pores begin to form. This is correlated to the self-trapping of light the system occurring above this power. Stronger self-focusing with power, pulls the light closer together over a great depth of the sample, result in larger deeper pores. Within the available intensity range, no upper limit was found above which pore formation was not possible. The mixture requires a reasonable photopolymerization rate to induce the molecular weight growth to induce phase separation. Pore formation needs high intensity, and a maximal intensity at which the process could not happen was not identified. Increased intensity helps because the reaction is already so slow due to the dilution effect of DMSO and the low intensity conditions.

The approach of the present invention for eliciting self-trapping and consequent phase separation is quite attractive for the production of microporous surfaces for several reasons. Firstly, the process is relatively straightforward, entailed a simple visible light source and mask, and a resin over a transparent surface. Secondly the process is scalable, which can be achieved with larger light sources and greater area films. Thirdly, the process is quite versatile, as self-trapping can be achieved in wide range of polyfunctional acrylates. Fourthly, the regularity in the pore structure is quite attractive, in contrast to the irregular pore structures as with other methods, for ensure consisting wetting and surface functional properties. Fifthly, the mask enables tuning the pore arrange to variety of symmetries and arrangement. Sixthly, it is possible to produce membranes by pushing the pores to permeate to over the entire depth of the film, which can be attractive for the photocuring of permeable micropore membranes.

In summary, the present invention provides a new approach whereby the microporous surfaces may be created through PIPPS in photopolymer solvent mixtures, through the combination of photopolymerization with light self-focusing and self-trapping. The self-trapping of light sets fixed regions of brightness and darkness, sustained by the polymerization of light, and then the wave guiding. Upon the entry of the system into instability, phase separation occurs with the solvent phase separating in the regions of darkness, and the TMPTA dominating the fixed owing to crosslinking in the regions of brightness. Upon removal of the solvent, precise uniform disperse pores are created. The pore size and spacing may be tuned through weight fraction as well as the mask pattern. The pores can be varied and created in films of different thicknesses. Confocal Raman spectroscopy indicated as the system undergoes phase separation. Through surface functionalization, the surfaces can be may superhydrophobic, enabling them to be strong anti-wetting surfaces. The approach of the present is scalable and straight forward.

EXAMPLE

Materials.

Trimethylolpropane triacrylate (TMPTA) and Polytetrafluoroethylene (PTFE) nanoparticles (200-300 nm) were purchased from Sigma-Aldrich. The visible-light photoinitiator system consisted of free-radical initiator camphorquinone (CQ) purchased from Sigma Aldrich, and cationic initiator (4-octyloxyphenyl) phenyliodonium hexafluoroantimonate (OPPI) purchased from Hampford Research Inc. All chemicals were used as received.

Preparation of Photopolymerizable Mixtures.

Photopolymerizable mixtures were prepared by mixing TMPTA (our photopolymer) and DMSO (our porogen) of different relative weight fractions, and dissolving in it CQ (2.5 wt % of total mixture) and OPPI (1.5 wt % of total mixture). Mixtures were continuously stirred for 24 hours, while protected from exposure to ambient light. CQ sensitizes the photoreactive blend to blue light ($\lambda_{max}$=~470 nm), initiates the free-radical polymerization of TMPTA, and facilitates free-radical decomposition of OPPI which accelerates the photopolymerization. From here on mixtures are referred to by their relative weight fraction of TMPTA to DMSO.

Photopolymerization of Mixtures.

The mixture was poured into an open well consisting of a Teflon ring, placed on top of a plastic or glass substrate. The photoreactive blends contained in the wells were placed onto a homemade stage and irradiated from below with collimated blue light from a light-emitting diode (LED) ($\lambda_{max}$=470 nm, Thorlabs Inc.) at an exposure intensity within 1-15 mW/cm$^2$. LED light was first passed through a photomask (Photosciences Inc.), consisting of a square array of chrome circles with different diameters (D) and spacing (S), and subsequently transmitted through the blend. Hereon, the masks are referred to by their diameter (D) to spacing (S) ratio, D/S.

Imaging of Transmitted Light.

To observe light self-trapping in the samples during irradiation, the transmitted light was passed through imaging optics and then focused onto a charge-coupled device (CCD) camera with pixel resolution of 3.2×3.2 µm (Dataray, WinCAMD-XHR). The imaging setup captured the spatial intensity profile of the transmitted beam at the surface of the mixture from which light exits.

Surface Coating.

The microporous surfaces were covered with a thin layer of PTFE nanoparticles using a commercially available spray coater. PTFE nanoparticles (2 wt %) were dispersed in ethanol through ultra-sonication (5 min.) then loaded into the spray coater. Spray coating was applied onto the samples using nitrogen as the carrier gas and an applied flow pressure of 40 psi.

Materials Characterization.

Electron microscopy was carried out with a Scanning Electron Microscope (Joel 5600) under an accelerating voltage of 5 keV. Samples were first coating with a thin layer of metal for imaging purposes. Compositional mapping was carried out with a confocal Raman spectrometer (InVia, Renishaw) using a 785 nm laser excitation. Details of the Raman mapping procedure can be found in our previous work. A three-dimensional (3D) volume map of a final cured mixture was obtained by collecting spectra at multiple positions in a sample with 10 µm step size. Raman volumes were generated by mapping the ratio of intensity peak of TMPTA (1720 cm$^{-1}$) to DMSO (680 cm$^{-1}$) over the mixture depth to identify regions relatively rich in TMPTA.

Wettability Measurements.

Static contact angle measurements were performed via the sessile drop method using Ramé-Hart 250 F1 contact angle goniometer. A water droplet was placed onto the substrate, and a circular drop profile from the camera was used to determine the contact angles using DROP Image Advanced software. Contact angles are reported as the average of 10 measurements.

What is claimed is:

1. A method of fabricating a porous surface, comprising the steps of:
    providing a mixture including a monomer and a solvent;
    positioning a mask having a predetermined series of chrome regions against the mixture to define a series of dark regions in the mixture that correspond to the series of chrome regions in the mask and an irradiated region in the mixture;
    irradiating a first side of the mixture through the mask to form an exit face on the opposing side of the mixture and a modulated light pattern in the irradiated region of the mixture that becomes self-trapped in the irradiated region during the irradiating;
    continuing to irradiate the mixture so that the self-trapped light pattern in the irradiated region of the mixture causes the monomer to be polymerized into a polymer in the self-trapped light pattern of the irradiated region of the mixture and the solvent phase separates out of the portions of the mixture in the self-trapped light pattern of the irradiated region of the mixture and into the series of dark regions; and
    continuing to irradiate the mixture to form a polymer substrate having a series of pores that are positioned in the exit face and that correspond to the series of dark regions of the mask.

2. The method of claim 1, further comprising the step of spray coating the polymer substrate with a plurality of nanoparticles.

3. The method of claim 2, wherein the nanoparticles comprise polytetrafluoroethylene (PTFE).

4. The method of claim 1, wherein the step of irradiating the mixture comprises irradiating with light having a wavelength of 470 nm.

5. The method of claim 4, wherein the step of irradiating the mixture comprises irradiating with light at an exposure intensity between 2 and 20 mW/cm2.

6. The method of claim 1, wherein the monomer comprises trimethylolpropane triacrylate (TMPTA).

7. The method of claim 6, wherein the solvent comprises dimethyl sulfoxide (DMSO).

8. The method of claim 7, wherein the ratio of the monomer to the solvent ranges from 9:1 to 6:4 by weight percent.

9. The method of claim 1, wherein each of the predetermined series of chrome regions has a diameter between 10 and 40 micrometers.

10. The method of claim 9, wherein the predetermined series of chrome regions are spaced apart from each other by a distance between 50 and 100 micrometers.

11. The method of claim 1, wherein the polymer substrate has a thickness between 100 and 400 micrometers.

* * * * *